(12) United States Patent
Hayase et al.

(10) Patent No.: US 7,601,465 B2
(45) Date of Patent: Oct. 13, 2009

(54) HOLOGRAPHIC RECORDING MEDIUM

(75) Inventors: Rumiko Hayase, Yokohama (JP); Akiko Hirao, Chiba (JP); Kazuki Matsumoto, Kawasaki (JP); Norikatsu Sasao, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 321 days.

(21) Appl. No.: 11/390,481

(22) Filed: Mar. 28, 2006

(65) Prior Publication Data

US 2007/0030541 A1 Feb. 8, 2007

(30) Foreign Application Priority Data

Aug. 8, 2005 (JP) .............................. 2005-229741

(51) Int. Cl.
*G03H 1/04* (2006.01)
(52) U.S. Cl. ...................... 430/1; 430/2; 430/281.1; 359/3; 522/12; 522/27; 522/28; 522/29
(58) Field of Classification Search ........................ None
See application file for complete search history.

(56) References Cited

U.S. PATENT DOCUMENTS

| | | | |
|---|---|---|---|
| 6,022,906 A | 2/2000 | Ohwa et al. | |
| 6,780,546 B2 | 8/2004 | Trentler et al. | |
| 2003/0087163 A1 | 5/2003 | Otaki et al. | |
| 2004/0233831 A1* | 11/2004 | Matsumoto et al. | 369/275.1 |
| 2005/0174917 A1* | 8/2005 | Matsumoto et al. | 369/103 |
| 2005/0185232 A1* | 8/2005 | Teranishi et al. | 359/3 |
| 2005/0195722 A1* | 9/2005 | Tsukamoto et al. | 369/103 |
| 2005/0196679 A1* | 9/2005 | Hayase et al. | 430/1 |
| 2006/0014081 A1* | 1/2006 | Hayase et al. | 430/1 |
| 2006/0115740 A1* | 6/2006 | Hayase et al. | 430/1 |

FOREIGN PATENT DOCUMENTS

| | | | |
|---|---|---|---|
| CN | 1504828 A | | 6/2004 |
| CN | 1672195 A | | 9/2005 |
| EP | 1553447 | * | 7/2005 |
| JP | 02-233704 | * | 9/1990 |
| JP | 11-352303 | | 12/1999 |
| JP | 2006-030661 | * | 2/2006 |
| WO | 2006/086646 | * | 8/2006 |

OTHER PUBLICATIONS

Trentler et al., *Epoxy-Photopolymer Composites: Thick Recording Media for Holographic Data Storage*, Proceedings of SPIE vol. 4296 (2001); pp. 259-266.
Chinese Office Action with English-language Translation dated May 30, 2008.

* cited by examiner

*Primary Examiner*—Martin J Angebranndt
(74) *Attorney, Agent, or Firm*—Nixon & Vanderhye P.C.

(57) ABSTRACT

A holographic recording medium has a recording layer including a radical-polymerizable compound, a first photo-radical polymerization initiator (A) containing a titanocene compound, and a second photo-radical polymerization initiator (B) containing at least one compound selected from the group consisting of an amino acetophenone derivative, an acylphosphine oxide derivative, a benzyl derivative, and a thioxanthone derivative.

17 Claims, 3 Drawing Sheets

F I G. 7 ved signals of the holo-
HOLOGRAPHIC RECORDING MEDIUM

CROSS-REFERENCE TO RELATED APPLICATIONS

This application is based upon and claims the benefit of priority from prior Japanese Patent Application No. 2005-229741, filed Aug. 8, 2005, the entire contents of which are incorporated herein by reference.

BACKGROUND OF THE INVENTION

1. Field of the Invention

The present invention relates to a holographic recording medium.

2. Description of the Related Art

A holographic memory that records data in the form of a hologram is capable of high capacity recording and, thus, attracts attention as a next-generation recording medium. There has been known a photosensitive composition for the holographic recording represented by Omnidex (registered trademark, DuPont Company) that contains, as main components, a radical-polymerizable monomer, a thermoplastic binder resin, a photo-radical polymerization initiator and a sensitizing dye. Such a photosensitive composition for the holographic recording is formed into a film and, then, the film is exposed to light beams so as to bring about interference between the light beams, thereby recording data. In regions where the light beams are applied strongly, radical polymerization occurs. When the radical polymerization proceeds, the radical-polymerizable monomers are diffused from regions where the light beams are applied weakly toward the regions where the light beams are applied strongly, resulting in a concentration gradient of the radical-polymerizable monomers. Thus, in accordance with intensities of interfered light, differences in densities of the radical-polymerizable monomers are generated and differences in refractive indexes are produced.

Recently, holographic recording media using an improved polymer matrix have been proposed. For example, Japanese Patent Application Kokai Publication No. 11-252303 discloses a holographic recording medium including a three-dimensional cross-linked polymer matrix in which polymerizable monomers are dispersed. Also, a document reports a holographic recording medium including an epoxy resin matrix in which photo-polymerizable monomers are dispersed (see T. J. Trentler, J. E. Boid and V. L. Colvin, "Epoxy-Photopolymer Composites: Thick Recording Media for Holographic Data storage": Proceedings of SPIE, 2001, Vol. 4296, pp. 259-266).

On the other hand, U.S. Pat. No. 6,780,546 discloses a holographic recording medium containing a photo-radical polymerization initiator that exhibits high sensitivity to a blue laser beam.

However, as a result of extensive research, the present inventors have found that the sensitivity of the highly-sensitive photo-radical polymerization initiator is markedly degraded with time, resulting in poor storage stability.

BRIEF SUMMARY OF THE INVENTION

A holographic recording medium according to an aspect of the present invention, comprises a recording layer comprising: a radical-polymerizable compound; a first photo-radical polymerization initiator (A) containing a titanocene compound; and a second photo-radical polymerization initiator (B) containing at least one compound selected from the group consisting of an amino acetophenone derivative, an acylphosphine oxide derivative, a benzyl derivative, and a thioxanthone derivative.

A holographic recording medium according to another aspect of the present invention, comprises a recording layer comprising: a radical-polymerizable compound; and first and second photo-radical polymerization initiators (A) and (B) each exhibiting absorption at a wavelength of recording light, the first photo-radical polymerization initiator (A) having an absorption maximum at a wavelength longer than that of the recording light, and the second photo-radical polymerization initiator (B) having an absorption maximum at a wavelength shorter than that of the recording light.

DETAILED DESCRIPTION OF THE INVENTION

In the holographic recording medium according to an embodiment of the present invention, used are two types of photo-radical polymerization initiators exhibiting absorption to the wavelength of the recording light, i.e., a first photo-radical polymerization initiator (A) having an absorption maximum at a wavelength longer than that of the recording light, and a second photo-radical polymerization initiator (B) having an absorption maximum with a longest wavelength at a wavelength shorter than that of the recording light. Since these two types of the photo-radical polymerization initiators (A) and (B) absorb the recording light, they generate radicals upon irradiation with the recording light, with the result that the radical-polymerizable compounds are polymerized by the radicals.

For photocuring resin, it has been already known that mixing two types of photo-radical polymerization initiators thereto improves the sensitivity. It should be noted, however, that a UV lamp that emits light with various wavelengths is generally used to cure the photocuring resin. In contrast, the embodiment of the present invention uses two types of photo-radical polymerization initiators (A) and (B) having absorption maximums on both sides of the specific wavelength of the recording light. In the case of using these two types of photo-radical polymerization initiators (A) and (B) together, it has been found that the sensitivity can be made higher than the sum of the sensitivity values provided by using singly each of the first and second photo-radical polymerization initiators (A) and (B). The mechanism for producing the particular effect has not yet been clarified. However, it is expected that the second photo-radical polymerization initiator (B) is activated by the energy transfer from the first photo-radical polymerization initiator (A) or a photodecomposition product thereof so that radicals are generated more efficiently.

In addition, the first photo-radical polymerization initiator (A) having an absorption maximum at a wavelength longer than that of the recording light generally exhibits higher absorbance to the wavelength of the recording light. Therefore, if the concentration of the first photo-radical polymerization initiator (A) is increased in an attempt to improve the sensitivity, the recording layer may be degraded in transmittance and, thus, in diffraction efficiency. Here, if the second photo-radical polymerization initiator (B) having an absorption maximum at a wavelength shorter than that of the recording light is used at the same time, it is possible to lower the concentration of the first photo-radical polymerization initiator (A) having an absorption maximum at a wavelength longer than that of the recording light. Accordingly, it is possible to provide a medium having high transmittance, high sensitivity and a high dynamic range. Further, the total concentration of the photo-radical polymerization initiator including the first and second photo-radical polymerization initiators (A) and (B) is sufficiently high enough to suppress degradation of sensitivity caused by deterioration of the photo-radical polymerization initiator.

It is also well known that addition of a sensitizing dye exhibiting absorption at a wavelength longer than a specified wavelength of the recording light is effective to improve sensitivity. However, the first photo-radical polymerization initiator (A) according to the embodiment of the present invention differs from the sensitizing dye in that it generates radicals upon irradiation with light, and thus it is advantageous over the sensitizing dye in the effect of improving the sensitivity.

The photo-radical polymerization initiator can be selected in accordance with the wavelength of the recording light. Examples of the photo-radical polymerization initiator include benzoin ether, benzyl ketal, benzyl, acetophenone derivatives, amino acetophenones, benzophenone derivatives, acylphosphine oxides, triazines, imidazole derivatives, organic azide compounds, titanocenes, organic peroxides and thioxanthone derivatives.

To be more specific, examples of the photo-radical polymerization initiator include benzyl, benzoin, benzoin ethyl ether, benzoin isopropyl ether, benzoin butyl ether, benzoin isobutyl ether, 1-hydroxycyclohexyl phenyl ketone, benzyl methyl ketal, benzyl ethyl ketal, benzyl methoxyethyl ketal, 2,2'-diethylacetophenone, 2,2'-dipropylacetophenone, 2-hydroxy-2-methylpropiophenone, p-tert-butyltrichloroacetophenone, thioxanthone, 1-chlorothioxanthone, 2-chlorothioxanthone, 2-methylthioxanthone, 2-isopropylthioxanthone, 3,3',4,4'-tetra(t-butylperoxycarbonyl)benzophenone, 2,4,6-tris(chloromethyl)-1,3,5-triazine, 2-(p-methoxyphenyl)-4,6-bis(trichloromethyl)-1,3,5-triazine, 2-[(p-methoxyphenyl)ethylene]-4,6-bis(trichloromethyl)-1,3,5-triazine, diphenyl-(2,4,6-trimethylbenzoyl) phosphine oxide, Irgacure (registered trademark) 149, 184, 369, 651, 784, 819, 907, 1700, 1800, 1850, which are available from Ciba Specialty Chemicals, di-t-butyl peroxide, dicumyl peroxide, t-butyl cumyl peroxide, t-butyl peroxyacetate, t-butyl peroxyphthalate, t-butyl peroxybenzoate, acetyl peroxide, isobutyryl peroxide, decanoyl peroxide, lauroyl peroxide, benzoyl peroxide, t-butyl hydroperoxide, cumene hydro eroxide, methyl ethyl ketone peroxide and cyclohexanone peroxide.

Where blue laser light with a wavelength of 405 nm is used as the recording light, it is desirable to use a titanocene compound such as Irgacure 784 (available from Ciba Specialty Chemicals) as the first photo-radical polymerization initiator (A), and amino acetophenones such as Irgacure 369 (available from Ciba Specialty Chemicals), phosphine oxides such as diphenyl-(2,4,6-trimethylbenzoyl)phosphine oxide and Irgacure 819 (available from Ciba Specialty Chemicals), benzyl and thioxanthone derivatives as the second photo-radical polymerization initiator (B).

As a typical example of the first photo-radical polymerization initiator (A), chemical formula (1) given below shows bis (η5-2,4-cyclopentadien-1-yl)-bis(2,6-difluoro-3-(1H-pyrrole-1-yl)-phenyl) titanium [absorption maximum (in methanol): 398 nm, 470 nm], which is a titanocene compound Irgacure 784 available from Ciba Specialty Chemicals.

As typical examples of the second photo-radical polymerization initiator (B), chemical formula (2) given below shows 2-benzyl-2-(dimethylamino)-1-[4-morpholinyl]phenyl]-1-butanone [absorption maximum (in methanol): 233 nm, 324 nm], which is an amino acetophenone derivative, Irgacure 369, available from Ciba Specialty Chemicals, chemical formula (3) given below shows diphenyl-(2,4,6-trimethylbenzoyl)phosphine oxide, which is an acylphosphine oxide derivative [absorption maximum (in methanol): 367 nm, 383 nm, 398 nm] available from Aldrich, and chemical formula (4) given below shows bis(2,4,6-trimethylbenzoyl)phenylphosphine oxide [absorption maximum (in methanol): 295 nm, 370 nm], which is an acylphosphine oxide derivative, Irgacure 819, available from Ciba Specialty Chemicals.

-continued (4)

The first and second photo-radical polymerization initiators (A) and (B) is used within such an amount that the holographic recording medium has transmittance to the recording light in a range of 10 to 95%, more preferably 20 to 90%. If the transmittance of the recording medium to the recording light is lower than 10%, sensitivity and diffraction efficiency of the recording medium may be lowered. If the transmittance exceeds 95%, the recording light may be scattered, resulting in failure to record data to the recording layer accurately.

Total mixing ratio of the first and second photo-radical polymerization initiators (A) and (B) is set to be 0.1 to 20% by weight, preferably 0.2 to 10% by weight based on the whole recording layer. If the total mixing ratio noted above is smaller than 0.1% by weight, it may be difficult to provide a sufficient change in refractive index in the recording layer. If the total mixing ratio exceeds 20% by weight, absorbance may be made excessively high to lower sensitivity and diffraction efficiency of the recording layer.

In the embodiments of the present invention, the recording layer desirably comprises a three-dimensional cross-linked polymer matrix formed of a cured resin of an epoxy compound and a curing agent. Since the polymer matrix is three-dimensional cross-linked, shrinkage of the recording layer is suppressed.

Examples of the epoxy compound include 1,4-butanediol diglycidyl ether, 1,6-hexanediol diglycidyl ether, diethylene glycol diglycidyl ether, polyethylene glycol diglycidyl ether, polypropylene glycol diglycidyl ether, neopentyl glycol diglycidyl ether, diepoxyoctane, resorcinol diglycidyl ether, diglycidyl ether of bisphenol A, diglycidyl ether of bisphenol F, 3,4-epoxycyclohexenylmethyl-3',4'-epoxycyclohexene carboxylate and epoxypropoxypropyl terminated polydimethylcyclohexane.

Examples of the curing agent for the epoxy compound include amines, phenols, organic acid anhydrides and amides, which are known as the curing agent for the epoxy compound. To be more specific, examples of the curing agent for the epoxy compound include ethylenediamine, diethylenetriamine, triethylenetetramine, tetraethylenepentamine, pentaethylenehexaamine, hexamethylenediamine, menthenediamine, isophoronediamine, bis(4-amino-3-methyldicyclohexyl)-methane, bis(aminomethyl)cyclohexane, N-aminoethylpiperazine, m-xylenediamine, 1,3-diaminopropane, 1,4-diaminobutane, trimethylhexamethylenediamine, iminobispropylamine, bis(hexamethylene)triamine, 1,3,6-trisaminomethylhexane, dimethylaminopropylamine, aminoethylethanolamine, tri(methylamino)hexane, m-phenylenediamine, p-phenylenediamine, diaminodiphenylmethane, diaminodiphenylsulfone, 3,3'-diethyl-4,4'-diaminodiphenylmethane, maleic anhydride, succinic anhydride, tetrahydrophthalic anhydride, methyltetrahydrophthalic anhydride, methylnadic anhydride, hexahydrophthalic anhydride, methylhexahydrophthalic acid, methylcyclohexenetetracarboxylic anhydride, phthalic anhydride, trimellitic anhydride, benzophenonetetracarboxylic anhydride, dodecenylsuccinic anhydride, ethylene glycol bis(anhydrotrimellitate), phenol novolak resin, cresol novolak resin, polyvinyl phenol, terpene phenol resin and polyamide resin.

Aliphatic primary amines which bring about rapid curing and enable curing at room temperature are preferably. In particular, diethylenetriamine, triethylenetetramine, tetraethylenepentamine, pentaethylenehexaamine and iminobispropylamine are sitable among the aliphatic primary amines. The amine is preferably used in such a mixing ratio that the NH group of the amine is set to 0.6 to 2 equivalents as much as the oxirane group of the epoxy compound. If the amount of the NH group of the amine is smaller than 0.6 equivalents or exceeds 2 equivalents, sensitivity and diffraction efficiency may be lowered.

Further, it is possible to add a curing catalyst to the mixture of the epoxy compound and the curing agent, as required. It is possible to use a basic catalyst which is known as a curing catalyst for the epoxy compound. Examples of the basic catalyst include tertiary amines, organic phosphine compounds, imidazole compounds and derivatives thereof. To be more specific, examples of the basic catalyst include triethanolamine, piperidine, N,N'-dimethylpiperazine, 1,4-diazadicyclo(2,2,2)octane(triethylenediamine), pyridine, picoline, dimethylcyclohexylamine, dimethylhexylamine, benzyldimethylamine, 2-(dimethylaminomethyl)phenol, 2,4,6-tris(dimethylaminomethyl)phenol, 1,8-diazabicyclo[5,4,0]undec-7-ene (DBU) or phenol salts thereof, trimethylphosphine, triethylphosphine, tributylphosphine, triphenylphosphine, tri(p-methyl phenyl)phosphine, 2-methylimidazole, 2,4-dimethylimidazole, 2-ethyl-4-methylimidazole, 2-phenylimidazole, 2-phenyl-4-methylimidazole, and 2-heptaimidazole. A latent catalyst such as boron trifluoride-amine complex, dicyandiamide, organic acid hydrazide, diaminomaleonitrile and derivatives thereof, melamine and derivatives thereof and amineimide may be use. It is also possible to add a compound having active hydrogen such as phenols or carboxylic acid so as to promote the curing.

Examples of the radical-polymerizable compound include a compound having an ethylenic unsaturated double bond such as an unsaturated carboxylic acid, an unsaturated carboxylic ester, an unsaturated carboxylic amide, and a vinyl compound. To be more specific, examples of the radical-polymerizable compound include acrylic acid, methyl acrylate, ethyl acrylate, propyl acrylate, butyl acrylate, isobutyl acrylate, 2-ethylhexyl acrylate, octyl acrylate, lauryl acrylate, stearyl acrylate, cyclohexyl acrylate, bicyclopentenyl acrylate, phenyl acrylate, isobornyl acrylate, adamantyl acrylate, methacrylic acid, methyl methacrylate, propyl methacrylate, butyl methacrylate, phenyl methacrylate, phenoxyethyl acrylate, chlorophenyl acrylate, adamantyl methacrylate, isobornyl methacrylate, N-methylacrylamide, N,N-dimethylacrylamide, N,N-methylenebisacrylamide, acryloylmorpholine, vinylpyridine, styrene, bromostyrene, chlorostyrene, tribromophenyl acrylate, trichlorophenyl acrylate, tribromophenyl methacrylate, trichlorophenyl methacrylate, vinyl benzoate, 3,5-dichlorovinyl benzoate, vinylnaphthalene, vinyl naphthoate, naphtyl methacrylate, naphtyl acrylate, N-phenylmethacrylamide, N-phenylacrylamide, N-vinylpyrrolidinone, N-vinylcarbazole, 1-vinylimidazole, bicyclopentenylacrylate, 1,6-hexanediol diacrylate, pentaerythritol triacrylate, pentaerythritol tetraacrylate, dipentaerythritol hexaacrylate, diethylene glycol diacrylate, polyethylene glycol diacrylate, polyethylene glycol dimethacrylate, tripropylene glycol diacrylate, propylene glycol trimethacrylate, diallyl phthalate, and triallyl trimellitate. The radical-polymerizable compound is mixed with the three-dimensional cross-linked polymer matrix in an amount of 1 to 50% by weight, preferably 3 to 30% by weight. If the mixing ratio of the radical-polymerizable compound is smaller than 1% by weight, it is difficult to provide a sufficient change in the refractive index in the recording layer. If the mixing ratio exceeds 50% by weight, excessively large volumetric shrinkage of the recording layer may be brought about, resulting in lowered resolution.

It is also possible to add a sensitizing dye such as cyanine, merocyanine, xanthene, cumarin, or eosine, as well as a silane coupling agent and a plasticizer.

A holographic recording medium according to an embodiment of the present invention can be manufactured by the method described below. First, a solution of a recording layer material is prepared by mixing an epoxy compound, a curing agent, a photo-polymerizable monomer, and first and second photo-radical polymerization initiators (A) and (B). The solution of the recording layer material is applied to a substrate and then it is cured so as to allow the matrix polymer to be three-dimensionally cross-linked, thereby forming a recording layer.

A glass substrate or a plastic substrate can be used as the substrate. As a method of applying the solution of the recording layer material to the substrate, casting or spin coating may be used. Another method may be used which comprises arranging two glass substrates or plastic substrates in a manner to face each other with a resin spacer interposed therebetween and injecting the solution of the recording layer material into the gap between the two substrates. The three-dimensional cross-linkage of the matrix polymer proceeds even under room temperature in the case of using an aliphatic primary amine as the curing agent. However, the three-dimensional cross-linkage of the matrix polymer may be promoted by heating the material to about 30 to 150° C. in accordance with reactivity of the curing agent. The thickness of the recording layer may be set to 20 μm to 2 mm, more preferably 50 μm to 1 mm. Where the thickness of the recording layer is smaller than 20 μm, a sufficient memory capacity can not be provided, resulting in difficulty to differentiate the holographic recording medium from the conventional optical recording media such as CD and DVD. If the thickness of the recording layer exceeds 2 mm, sensitivity, diffraction efficiency and resolution of the holographic recording medium may be lowered.

For a holographic recording medium according to an embodiment of the present invention, holographic recording is carried out by allowing information beam and reference beam to interfere with each other within the recording layer. Hologram (holography) to be recorded may be any of the transmission-type hologram (transmission-type holography) and the reflection-type hologram (reflection-type holography). The method for bringing about interference between the information beam and the reference beam may be any of a two-beam interference method and a collinear interference method.

Figure 1:
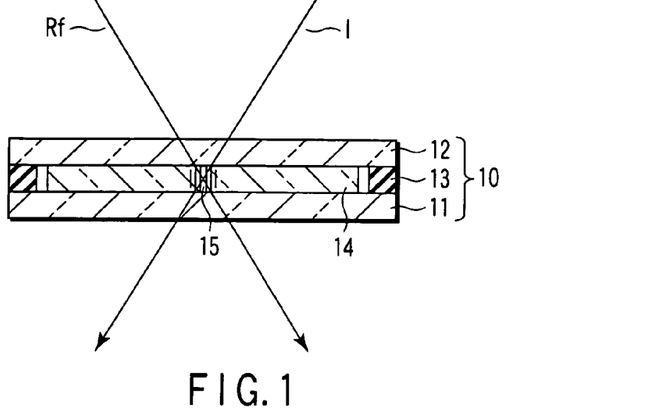
FIG. 1 is a cross-sectional view showing a transmission-type holographic recording medium according to an embodiment of the present invention.

FIG. 1 is a cross-sectional view showing a transmission-type holographic recording medium 10 used in two-beam interference holography according to an embodiment of the present invention. The holographic recording medium 10 comprises a pair of transparent substrates 11, 12 arranged with a spacer 13 interposed therebetween to form a prescribed gap, and a recording layer 14 disposed in the gap between the transparent substrates 11 and 12. The recording layer 14 contains a three-dimensional cross-linked polymer matrix, a radical-polymerizable compound, and first and second photo-radical polymerization initiators (A) and (B). The transmission-type holographic recording medium 10 is irradiated with the information beam I and the reference beam Rf. The information beam I and the reference beam Rf cross and interfere with each other in the recording layer 14 to form a transmission-type hologram in a refractive index-modulated region 15.

Figure 2:
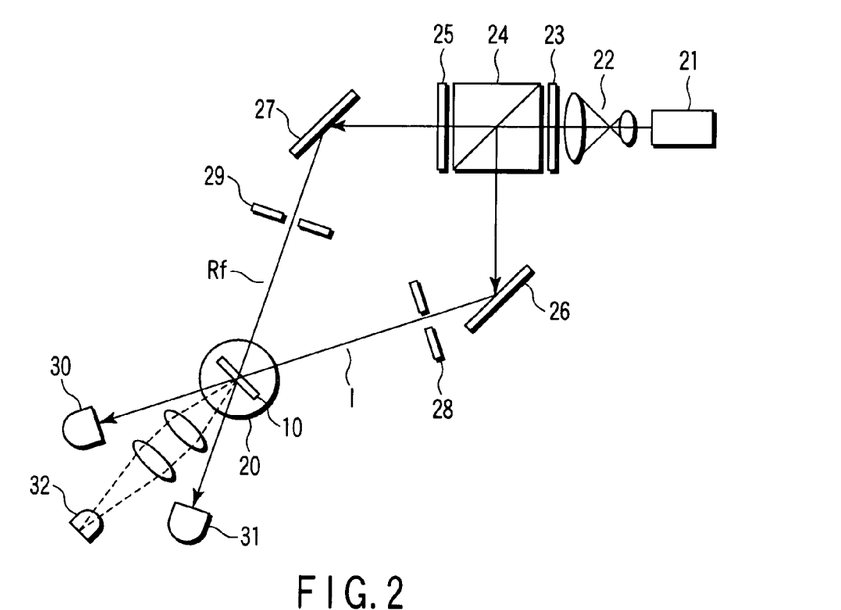
FIG. 2 is a schematic diagram showing a transmission-type holographic recording-reproducing apparatus according to an embodiment of the present invention.

FIG. 2 is a schematic diagram showing an example of a transmission-type holographic recording-reproducing apparatus according to an embodiment of the present invention. The holographic recording-reproducing apparatus uses the transmission-type two-beam interference method. The holographic recording medium 10 is supported by a rotary stage 20. The light source device 21 may be any light source that emits light capable of interfering in the recording layer 14 of the holographic recording medium 10. Linearly polarized laser light is desirable in view of coherency. Examples of the laser include a semiconductor laser, a He—Ne laser, an argon laser and a YAG laser. The light beam emitted from the light source device 21 is incident on a polarization beam splitter 24 via a beam expander 22 and a rotating optical element 23. The beam expander 22 expands the light beam emitted from the light source device 21 so as to have a diameter adapted for the holographic recording. The rotating optical element 23 rotates the plane of polarization of the expanded light beam through the beam expander 22 so as to generate a light beam including an S-polarized component and a P-polarized component. As the rotating optical element 23, a half-wave plate or a quarter-wave plate, for example, may be used.

Of the light beam having passed through the rotating optical element 23, the S-polarized component is reflected by the polarization beam splitter 24 which is used as the information beam I, and the P-polarized component is transmitted through the polarization beam splitter 24 which is used as the reference beam Rf. It should be noted that the rotation direction of the plane of polarization of the light beam incident on the polarization beam splitter 24 is controlled by the rotating optical element 23 so as to make the intensities of the information beam I and the reference beam Rf equal to each other at the position of the recording layer 14 in the holographic recording medium 10.

The information beam I reflected by the polarization beam splitter 24 is reflected by a mirror 26, and then passes through an electromagnetic shutter 28 to be applied to the recording layer 14 of the holographic recording medium 10 supported by the rotary stage 20.

On the other hand, the reference beam Rf having passed through the polarization beam splitter 24 is incident on a rotating optical element 25 where the polarization direction thereof is rotated by 90° into an S-polarized light. The reference beam Rf is reflected by a mirror 27, and then passes through an electromagnetic shutter 29 to be applied to the recording layer 14 of the holographic recording medium 10 supported by the rotary stage 20 in such a manner that the reference beam Rf crosses with the information beam I therein. As a result, a transmission-type hologram is formed in the refractive index-modulated region 15.

In order to reproduce the recorded data, the electromagnetic shutter 28 is closed so as to shut off the information beam I and to allow the reference beam Rf alone to be applied to the transmission-type hologram (refractive index-modulated region 15) formed within the recording layer 14 of the holographic recording medium 10. When passing through the holographic recording medium 10, the reference beam Rf is partly diffracted by the transmission-type hologram. The diffracted light is detected by a photodetector 30. A photodetector 31 for monitoring the light passing through the holographic recording medium 10 is also arranged.

In order to polymerize the unreacted radical-polymerizable compound after the holographic recording so as to make the recorded hologram stable, an ultraviolet light source device 32 and an optical system for ultraviolet light irradiation may be provided as shown in the drawing. Any light source that emits light capable of polymerizing the unreacted radical-polymerizable compound may be used as the ultraviolet light source device 32. In view of efficiency for emitting ultraviolet light, it is desirable to use, for example, a xenon lamp, a mercury lamp, a high-pressure mercury lamp, a mercury xenon lamp, a gallium nitride-based light emitting diode, a gallium nitride-based semiconductor laser, an excimer laser, third harmonic generation (355 nm) of a Nd:YAG laser, and a fourth harmonic generation (266 nm) of a Nd:YAG laser as the ultraviolet light source 32.

Figure 3:
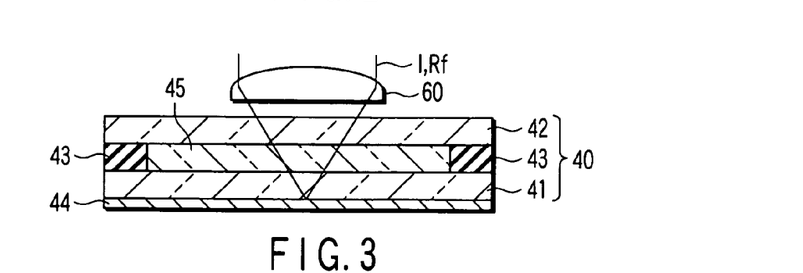
FIG. 3 is a cross-sectional view showing a reflection-type holographic recording medium according to another embodiment of the present invention.

FIG. 3 is a cross-sectional view showing a reflection-type holographic recording medium 40 according to an embodiment of the present invention. The holographic recording medium 40 comprises a pair of transparent substrates 41, 42 arranged with a spacer 43 interposed therebetween to form a prescribed gap, a reflecting layer 44 formed on the transparent substrate 41, and a recording layer 45 disposed in the gap between the transparent substrates 41 and 42. The recording layer 45 contains a three-dimensional cross-linked polymer matrix, a radical-polymerizable compound and first and second photo-radical polymerization initiators (A) and (B). The reflection-type holographic recording medium 40 is collinearly irradiated with both the information beam I and the reference beam Rf via an objective lens 60. The information beam I and the reference beam Rf interfere with each other in the recording layer 14 to form a reflection-type hologram in a refractive index-modulated region (not shown).

Figure 4:
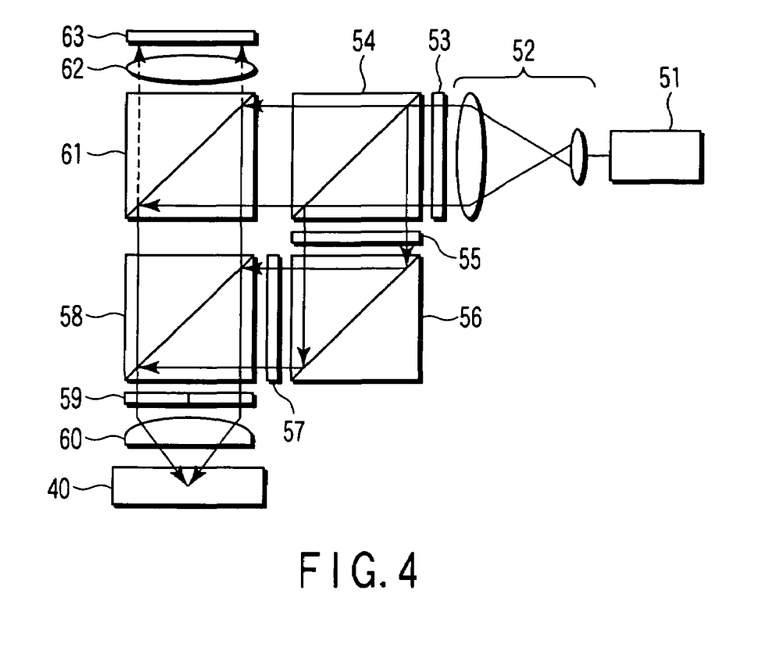
FIG. 4 is a schematic diagram showing a reflection-type holographic recording-reproducing apparatus according to another embodiment of the present invention.

FIG. 4 is a schematic diagram showing an example of a reflection-type holographic recording-reproducing apparatus according to an embodiment of the present invention. It is desirable to use as the light source device 51 a laser that emits coherent linearly polarized light like the case of the transmission-type holographic recording-reproducing apparatus. Examples of the laser include a semiconductor laser, a He—Ne laser, an argon laser and a YAG laser. The light beam emitted from the light source device 51 is expanded by a beam expander 52 and incident on a rotating optical element 53 as a parallel beam. The rotating optical element 53 rotates the plane of polarization of the light beam or converts the light beam into a circular polarized light beam or an elliptical polarized light beam so as to generate a light beam including a polarized component (P-polarized component) having a plane of polarization parallel to the plane of the paper sheet on which FIG. 4 is drawn and a polarized component (S-polarized component) having a plane of polarization perpendicular to the plane of the paper sheet. As the rotating optical element 53, a half-wave plate or a quarter-wave plate, for example, may be used.

Of the light beam emitted from the rotating optical element 53, the S-polarized component is reflected by the polarization beam splitter 24 and is incident on a transmission spatial light modulator 55. Of the light beam emitted from the rotating optical element 53, the P-polarized component is transmitted through the polarization beam splitter 24 which is used as the reference beam Rf as described below.

The transmission spatial light modulator 55 comprises a large number of pixels that are arranged to form a matrix like, for example, a transmission-type liquid crystal display, and the light emitted from each pixel can be switched to the P-polarized component or the S-polarized component. In this fashion, the transmission spatial light modulator 55 emits the information beam to which two-dimensional distribution of the plane of polarization is imparted corresponding to data to be recorded.

The information beam emitted from the transmission spatial light modulator 55 is incident on a polarization beam splitter 56. The polarization beam splitter 56 reflects the S-polarized component alone contained in the information beam and transmits the P-polarized component. The S-polarized component reflected by the polarization beam splitter 56 passes through an electromagnetic shutter 57 in the form of the information beam having a two-dimensional intensity distribution imparted thereto and, then, is incident on a polarization beam splitter 58. The information beam is reflected by the polarization beam splitter 58 and then is incident on a two-divided rotating optical element 59.

The two-divided rotating optical element 59 has different optical characteristics in the right section and the left section in FIG. 4. Specifically, the light component incident on the right section of the two-divided rotating optical element 59 is subjected to rotation of the plane of polarization by +45° and is emitted from the element 59, while the light component incident on the left section of the two-divided rotating optical element 59 is subjected to rotation of the plane of polarization by −45° and is emitted from the element 59. The S-polarized component whose plane of polarization is rotated by +45° (or the P-polarized component whose plane of polarization is rotated by −45°) is called A-polarized component hereinafter. Likewise, the S-polarized component whose plane of polarization is rotated by −45° (or the P-polarized component whose plane of polarization is rotated by +45°) is called B-polarized component hereinafter. It should be noted that a half-wave plate, for example, is used for each section of the two-divided rotating optical element 59.

The A-polarized component and the B-polarized component emitted from the two-divided rotating optical element 59 are incident on the holographic recording medium 40 through an objective lens 60 to be focused on the reflecting layer 44 through the transparent substrate 42, the recording layer 45 and the transparent substrate 41.

On the other hand, the P-polarized component having passed through the polarization beam splitter 54 is partly reflected by the beam splitter 61 so as to be transmitted through the polarization beam splitter 58. The reference beam having passed through the polarization beam splitter 58 is incident on the two-divided rotating optical element 59. The light component incident on the right section of the two-divided rotating optical element 59 is subjected to rotation of the plane of polarization by +45° and is emitted from the element 59 as a B-polarized component, while the light component incident on the left section of the two-divided rotating optical element 59 is subjected to rotation of the plane of polarization by −45° and is emitted from the element 59 as an A-polarized component. The A-polarized component and the B-polarized component are incident on the holographic recording medium 40 through the objective lens 60 so as to be focused on the reflecting layer 44 through the transparent substrate 42, the recording layer 45 and the transparent substrate 41.

As described above, the information beam of the A-polarized component and the reference beam of the B-polarized component are emitted from the right section of the two-divided rotating optical element 59. On the other hand, the information beam of the B-polarized component and the reference beam of the A-polarized component are emitted from the left section of the two-divided rotating optical element 59. The information beam and reference beam are focused on the reflecting layer 44 of the holographic recording medium 40. Thus, interference can be brought about between the information beam incident on the recording layer 45 as a direct beam through the transparent substrate 42 and the reference beam incident on the recording layer 45 as a reflected beam after reflected from the reflecting layer 44, and between the reference beam as a direct beam and the information beam as a reflected beam. It follows that the distribution of the optical characteristics corresponding to the information beam can be generated inside the recording layer 45. On the other hand, interference is not brought about between the information beam as a direct beam and the information beam as a reflected beam and between the reference beam as a direct light and the reference beam as a reflected beam.

In order to make the recorded hologram stable, an ultraviolet light source device 32 and an optical system for ultraviolet light irradiation may be provided in the reflection-type holographic recording-reproducing apparatus shown in FIG. 4 too.

The data recorded in the reflection-type holographic recording medium 40 can be read out as follows.

If the electromagnetic shutter 57 is closed, the reference beam of the P-polarized component alone is incident on the two-divided rotating optical element 59. The reference beam incident on the right section of the two-divided rotating optical element 59 is subjected to rotation of the plane of polarization by +45° and is emitted from the element 59 as a B-polarized component, while the reference beam incident on the left section of the two-divided rotating optical element 59 is subjected to rotation of the plane of polarization by −45° and is emitted from the element 59 as an A-polarized component. Then, the A-polarized component and the B-polarized component are incident on the holographic recording medium 40 through the objective lens 60 to be focused on the reflecting layer 44 through the transparent substrate 42, the recording layer 45 and the transparent substrate 41.

The distribution of the optical characteristics corresponding to the data is formed in the recording layer 45 of the holographic recording medium 40. It follows that the A-polarized component and the B-polarized component incident on the holographic recording medium 40 are partly diffracted by the distribution of the optical characteristics formed in the recording layer 45 and is emitted from the holographic recording medium 40 as reproduced light reconstructing the information beam.

The reproduced light emitted from the holographic recording medium 40 is formed into a parallel beam by the objective lens 60 and, then, is incident on the two-divided rotating optical element 59. The B-polarized component incident on the right section of the two-divided rotating optical element 59 is emitted as a P-polarized component, and the A-polarized component incident on the left section of the two-divided rotating optical element 59 is emitted as a P-polarized light. Thus, a reproduced light as the P-polarized component is obtained.

Then, the reproduced light is transmitted through the polarization beam splitter 58. The reproduced light passing through the polarization beam splitter 58 is partly transmitted through the beam splitter 61 and passes through an image-forming lens 62, and then forms an image on the two-dimensional photodetector 63 in the form of reconstructing the image on the transmission spatial light modulator 55. In this manner, the data recorded in the holographic recording medium 40 can be read out.

On the other hand, the remaining portions of the A-polarized component and the B-polarized component incident on the holographic recording medium 40 through the two-divided rotating optical element 59 are reflected by the reflecting layer 44 and are emitted from the holographic recording medium 40. The A-polarized component and the B-polarized component as reflected beams are converted into parallel beams. Then, the A-polarized component is incident on the right section of the two-divided rotating optical element 59 and is emitted as an S-polarized component, and the B-polarized component is incident on the left section of the two divided rotating optical element 59 and is emitted as an S-polarized component. The S-polarized component emitted from the two-divided rotating optical element 59 is reflected by the polarization beam splitter 61, and thus does not reach the two-dimensional photodetector 63. Therefore, the recording-reproducing apparatus makes it possible to realize reproduction excellent in signal-to-noise ratio.

The holographic recording medium according to the present invention can be suitably used for multiplexing recording-reproduction. The multiplexing recording-reproduction may be either transmission-type or reflection-type.

EXAMPLES

The present invention will now be described more in detail with reference to following Examples.

Example 1

Compounds shown in Table 1 were prepared. First, 3.02 g of 1,6-hexanediol diglycidyl ether (under the trademark Denacol EX-212 available from Nagase ChemteX, with an epoxy equivalent of 151) as an epoxy compound, 0.945 g of tetraethylene pentamine (TEPA) as a curing agent and 0.991 g of N-vinyl carbazole as a radical-polymerizable compound are mixed and stirred to prepare a uniform solution. Then, 0.022 g of Irgacure 784 (registered trademark, available from Ciba Specialty Chemicals, abbreviated as IC 784) as a first photo-radical polymerization initiator (A) and 0.099 g of Irgacure 369 (registered trademark, available from Ciba Specialty Chemicals, abbreviated as IC 368) as a second photo-radical polymerization initiator (B) were added to the above solution and stirred, and then the resultant solution was filtered with a filter of 0.5 μm and the filtrate was defoamed to prepare a precursor solution of a recording layer.

The precursor solution was injected into the gap between two glass substrates arranged with a spacer made of a polytetrafluoroethylene (PTFE) sheet interposed therebetween. The resultant structure was stored for 4 days at room temperature (25° C.) under a condition shielded from light to fabricate a test piece of a holographic recording medium having a recording layer with a thickness of 200 μm.

Since the polymer matrix precursor was cured at room temperature and three-dimensionally cross-linked, the recording layer was entirely made into a solid. The test piece was disposed on the rotary stage 20 of the holographic recording-reproducing apparatus shown in FIG. 2 to record a hologram. A semiconductor laser having a wavelength of 405 nm was used as the light source device 21. The light spot size on the test piece was 5 mm φ for each of the information beam I and the reference beam Rf, and the intensity of the recording light was adjusted to 7 mW/cm$^2$ based on the sum of the information beam and the reference beam.

After the holographic recording, the electromagnetic shutter 28 was closed to shut off the information beam I so as to allow the test piece to be irradiated with the reference beam Rf alone. As a result, diffracted light from the test piece was detected, supporting that a transmission-type hologram was recorded in the test piece. The internal diffraction efficiency ($\eta$) was obtained according to the following formula: $\eta = I_d/(I_t+I_d)$, where $I_d$ denotes the light intensity detected by the photodetector 30 and $I_t$ denotes the light intensity detected by the photodetector 31 when the holographic recording medium 12 was irradiated with the reference beam Rf alone. Sensitivity was determined as follows. The internal diffraction efficiency ($\eta$) to the one-half ($\frac{1}{2}$) power was plotted relative to the irradiating energy. Then, the inclination of the rise of the internal diffraction efficiency was determined as the sensitivity. The sensitivity was found to be $6.9 \times 10^{-3}$. The maximum value of the internal diffraction efficiency ($\eta$) was 79%.

The holographic recording medium was stored at room temperature under a condition shielded from light, and the same measurement as above was carried out 30 days after the injection of the precursor solution into the gap between the two glass substrates. The sensitivity was found to be $5.6 \times 10^{-3}$ and the maximum value of the internal diffraction efficiency ($\eta$) was 81%.

The recording dynamic range of the hologram was evaluated by M/# (M number). The M/# is defined by the formula given below using the internal diffraction efficiency $\eta$:

$$M/\# = \sum_{i=1}^{n} \sqrt{\eta_i},$$

where $\eta_i$ denotes the internal diffraction efficiency of the i-th hologram in the case where angular multiplexing recording/reproduction of n-pages of holograms is carried out until the recording is made impossible to the same region within the recording layer of the holographic recording medium. The angular multiplexing recording/reproduction was carried out by irradiating the holographic recording medium 20 with prescribed light while rotating the rotary stage 20. The holographic recording medium having a high value of M/# has a high recording dynamic range, and thus is excellent in the multiplex recording performance.

Figure 5:
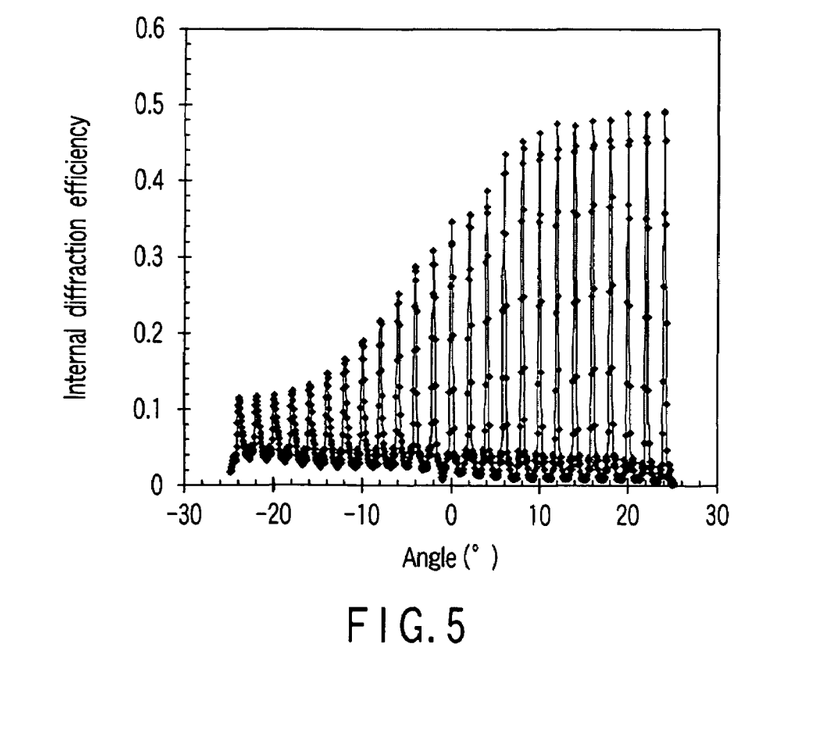
FIG. 5 is a graph showing reproduced signals of the holographic recording medium of Example 1 to which angular multiplexing recording has been performed.

FIG. 5 is a graph showing reproduced signals when the angular multiplexing recording/reproduction was carried out using the holographic recording medium for this Example at 4 days after the glass substrate was coated with the precursor of the recording layer. In this Example, the test piece was rotated by 2° using the rotary stage 20 every time one page was recorded, and the particular operation was repeated so as to perform angular multiplexing holographic recording for 25 pages in total within a range of −24° to +24°. Further, after the light was shielded and the holographic recording medium was left to stand for 5 minutes for awaiting the completion of the reaction, the diffraction efficiency $\eta$ was measured by rotating the rotary stage 20 so as to obtain the value of M/#. The value of M/# for the holographic recording medium for this Example was found to be 14.

Table 2 shows the results of the measurements of the sensitivity, the diffraction efficiency and the value of M/#.

Examples 2 to 5

The precursor of the recording layer was prepared as in Example 1 using the compounds shown in Table 1 and a holographic recording medium was manufactured as in Example 1. Also, the sensitivity, the diffraction efficiency and the value of M/# were measured as in Example 1. Table 2 shows the results.

Examples 6 and 7

The precursor of the recording layer was prepared as in Example 1 using the compounds shown in Table 1. The precursor of the recording layer for each of Examples 6 and 7 contained a curing catalyst for an epoxy compound. The precursor solution was injected into the gap between two glass substrates arranged with a spacer made of a polytetrafluoroethylene (PTFE) sheet interposed therebetween. The resultant structure was stored for 48 hours in an oven maintained at 60° C. under a condition shielded from light, followed by lowering the temperature to room temperature, and then was stored for two days at 25° C. to fabricate a test piece of a holographic recording medium having a recording layer with a thickness of 200 μm. The sensitivity, the diffraction efficiency and the value of M/# were measured as in Example 1 four days after the injection of the precursor solution into the gap between the two glass substrates. Similarly, the sensitivity, the diffraction efficiency and the value of M/# were measured 30 days after the injection of the precursor solution into the gap between the two glass substrates. Table 2 shows the results.

Comparative Examples 1 to 3

The precursor of the recording layer was prepared as in Example 1 using the compounds shown in Table 1. As shown in Table 1, the precursor of the recording layer for each of Comparative Examples 1 to 3 contained the first or second photo-radical polymerization initiator (A) or (B) alone. In the precursor of the recording layer for Comparative Example 2, the first photo-radical polymerization initiator (A) and a radical polymerization initiator made of organic peroxide were used in combination. Then, a holographic recording medium was manufactured as in Example 1. Also, the sensitivity, the diffraction efficiency and the value of M/# were measured as in Example 1. Table 2 shows the results.

Comparative Example 4

The precursor of the recording layer was prepared as in Example 1 using the compounds shown in Table 1. As shown in Table 1, the precursor of the recording layer for Comparative Example 4 contained one type of the first photo-radical polymerization initiator (A) alone and also contained a curing catalyst for the epoxy compound. The precursor solution of the recording layer was injected into the gap between two glass substrates arranged with a spacer made of a PTFE sheet interposed therebetween. The resultant structure was stored for 48 hours in an oven maintained at 60° C. under a condition shielded from light, followed by lowering the temperature to room temperature, and then was stored for two days at 25° C. to fabricate a test piece of a holographic recording medium having a recording layer with a thickness of 200 μm. The sensitivity, the diffraction efficiency and the value of M/# were measured as in Example 1 four days after the injection of the precursor solution into the gap between the two glass substrates. Similarly, the sensitivity, the diffraction efficiency and the value of M/# were measured 30 days after the injection of the precursor solution into the gap between the two glass substrates. Table 2 shows the results.

Here, the abbreviations and trade names given in Table 1 are summarized below:

Denacol EX212: 1,6-hexanediol diglycidyl ether, epoxy equivalent of 151, available from Nagase ChemteX;
Denacol EX211: neopentyl glycol diglycidyl ether, epoxy equivalent of 138, available from Nagase ChemteX;
TEPA: tetraethylene pentamine;
DETA: diethylene triamine;
DDSA: dodecenyl succinic acid;
DBU: 1,8-diazabicyclo[5,4,0]undec-7-ene;
DMP-30: 2,4,6-tris(dimethylaminomethyl)phenol;
VC: N-vinyl carbazole;
TBPA: 2,4,6-tribromophenyl acrylate;
IC784: Irgacure 784, available from Ciba Specialty Chemicals;
IC369: Irgacure 369, available from Ciba Specialty Chemicals;
IC819: Irgacure 819, available from Ciba Specialty Chemicals;
TPO: diphenyl-(2,4,6-trimethylbenzoyl)phosphine oxide;
Perbutyl H-69: t-butyl hydroperoxide, available from NOF Corporation;

TABLE 1

|  | Epoxy compound | Curing agent | Curing catalyst | monomer | Photo-initiator A | Photo-initiator B | Initiator |
|---|---|---|---|---|---|---|---|
| Example 1 | Denacol EX212 3.02 g | TEPA 0.945 g | — | VC 0.991 g | IC 784 0.022 g | IC 369 0.099 g | — |
| Example 2 | Denacol EX212 3.02 g | TEPA 0.945 g | — | VC 0.991 g | IC 784 0.022 g | TPO 0.099 g | — |
| Example 3 | Denacol EX212 3.02 g | TEPA 0.945 g | — | VC 1.057 g | IC 784 0.011 g | IC 369 0.264 g | — |
| Example 4 | Denacol EX212 3.02 g | TEPA 0.945 g | — | VC 0.991 g | IC 784 0.022 g | IC 819 0.248 g | — |
| Example 5 | Denacol EX212 3.02 g | DETA 0.721 g | — | VC 0.998 g | IC 784 0.010 g | IC 369 0.249 g | — |
| Example 6 | Denacol EX212 3.02 g | DDSA 5.328 g | DMP-30 0.053 g | TBPA 2.240 g | IC 784 0.022 g | IC 369 0.560 g | — |
| Example 7 | Denacol EX211 2.76 g | DDSA 5.328 g | DBU 0.030 g | TBPA 2.165 g | IC 784 0.022 g | TPO 0.541 g | — |
| Comparative Example 1 | Denacol EX212 3.02 g | TEPA 0.945 g | — | VC 0.991 g | — | TPO 0.099 g | — |
| Comparative Example 2 | Denacol EX212 10.57 g | DETA 2.524 g | — | VC 3.274 g | IC 784 0.074 g | — | Perbutyl H 0.015 g |
| Comparative Example 3 | Denacol EX212 3.02 g | TEPA 0.945 g | — | VC 0.991 g | IC 784 0.022 g | — | — |
| Comparative Example 4 | Denacol EX212 3.02 g | DDSA 4.795 g | DMP-30 0.056 g | TBPA 1.964 g | IC 784 0.044 g | — | — |

TABLE 2

|  | Sensitivity × 1000 | | Maximum internal diffraction efficiency (%) | | M/# |
|---|---|---|---|---|---|
|  | 4 days later | 30 days later | 4 days later | 30 days later | 4 days later |
| Example 1 | 6.9 | 5.6 | 79 | 81 | 16 |
| Example 2 | 5.5 | 3.6 | 81 | 88 | 13 |
| Example 3 | 11.0 | 10.0 | 76 | 77 | 16 |
| Example 4 | 3.1 | 1.9 | 77 | 68 | 11 |
| Example 5 | 12.0 | 8.8 | 77 | 78 | 14 |
| Example 6 | 17.0 | 12.0 | 77 | 75 | 15 |
| Example 7 | 15.0 | 11.0 | 72 | 72 | 12 |
| Comparative Example 1 | 4.0 | 1.3 | 78 | 70 | 6 |
| Comparative Example 2 | 20.0 | 3.3 | 82 | 88 | 5 |
| Comparative Example 3 | 3.0 | 0.9 | 85 | 80 | 7 |
| Comparative Example 4 | 16.0 | 5.3 | 78 | 72 | 11 |

Figure 6:
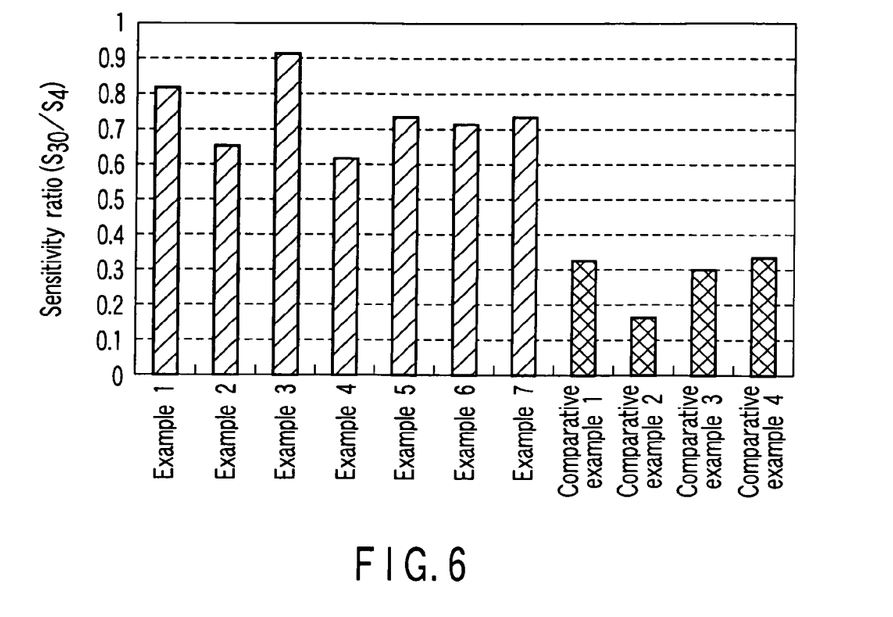
FIG. 6 is a graph showing the sensitivity 30 days after manufacture assuming that the sensitivity four days after manufacture is unity for the holographic recording media of Examples 1 to 7 and Comparative Examples 1 to 4.
Figure 7:
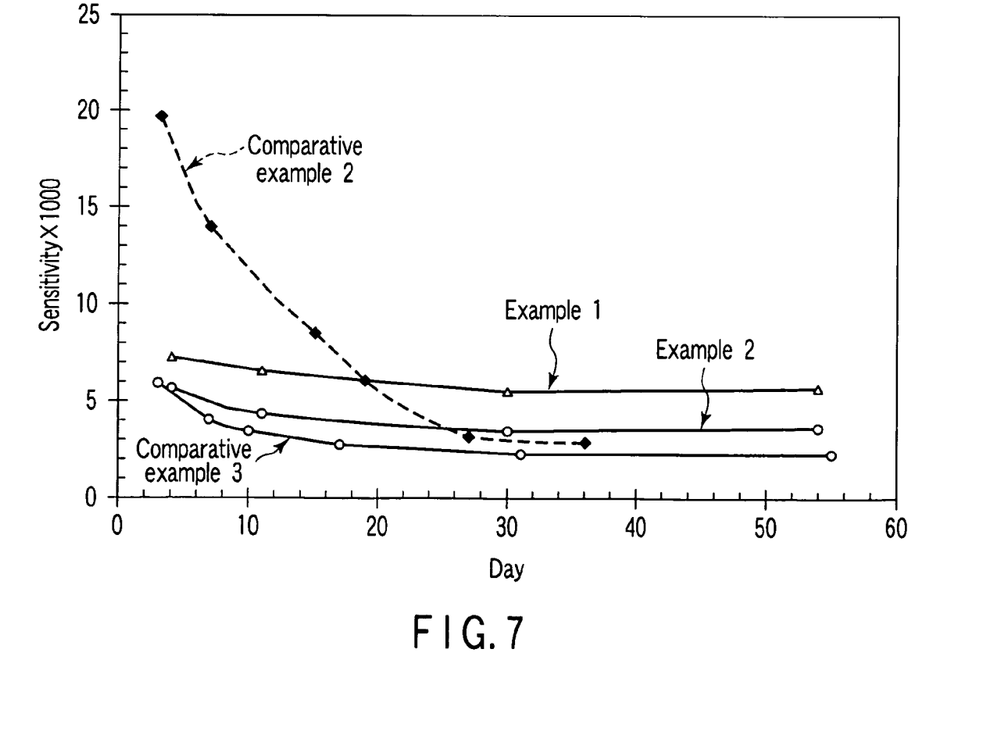
FIG. 7 is a graph showing change in the sensitivity with time for the holographic recording media of Example 1, Example 2, Comparative Example 2 and Comparative Example 3.

FIG. 6 is a graph showing the sensitivity ratio $S_{30}/S_4$, where $S_{30}$ is the sensitivity 30 days after manufacture and $S_4$ is the sensitivity four days after manufacture for the holographic recording media of Examples 1 to 7 and Comparative Examples 1 to 4. FIG. 7 is a graph showing change in the sensitivity with time for the holographic recording media of Example 1, Example 2, Comparative Example 2 and Comparative Example 3. The experimental data given in FIG. 7 covers the test period exceeding 50 days. It should be noted that the experimental data given in FIG. 7 slightly differ from those given in Table 2 in some cases. However, the difference was derived from the difference in the manufacturing lot of the material of the recording layer.

The experimental data given in Table 2, FIG. 6 and FIG. 7 support that the holographic recording medium for each of Examples 1 to 7 showed insignificant decrease of the sensitivity, i.e., excellent storage stability, compared with the holographic recording medium for each of Comparative Examples 1 to 4.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A holographic recording medium, comprising a recording layer comprising:
   a radical-polymerizable compound;
   a first photo-radical polymerization initiator (A) containing a titanocene compound; and
   a second photo-radical polymerization initiator (B) containing at least one compound selected from the group consisting of an amino acetophenone derivative, an acylphosphine oxide derivative, a benzyl derivative, and a thioxanthone derivative, wherein
   the recording layer contains a three-dimensional cross-linked polymer matrix formed of a cured resin of 1,6-hexanediol diglycidyl ether with either an amine or an organic acid anhydride as a curing agent.

2. The holographic recording medium according to claim 1, wherein the curing agent is an aliphatic primary amine.

3. The holographic recording medium according to claim 1, further comprising a curing catalyst for the epoxy compound.

4. The holographic recording medium according to claim 1, wherein a total mixing ratio of the first and second photo-radical polymerization initiators (A) and (B) is 0.1 to 20% by weight based on the entire recording layer.

5. The holographic recording medium according to claim 1, wherein the radical-polymerizable compound is contained in the three-dimensional cross-linked polymer matrix in a ratio of 1 to 50% by weight.

6. The holographic recording medium according to claim 1, wherein the recording layer is sandwiched between a pair of transparent substrates.

7. The holographic recording medium according to claim 6, wherein one of the transparent substrates is provided with a reflecting layer.

8. A holographic recording-reproducing apparatus recording in and reproducing from the holographic recording medium according to claim 1, comprising:
   a light source;
   an optical system which separates light emitted from the light source into an information beam and a reference beam and allows the information beam and the reference beam to be applied to the recording layer of the holographic recording medium via two optical paths, respectively; and
   a photodetector detecting reproduction light generated by irradiating the recording layer of the holographic recording medium with the reference beam alone.

9. A holographic recording-reproducing apparatus recording in and reproducing from the holographic recording medium according to claim 1, comprising:
   a light source;
   an optical system which separates light emitted from the light source into an information beam and a reference beam and allows the information beam and the reference beam to be applied collinearly to the recording layer of the holographic recording medium through two optical paths, respectively; and
   a photodetector detecting reproduction light generated by irradiating the recording layer of the holographic recording medium with the reference beam alone.

10. The holographic recording medium according to claim 1, wherein the first photo-radical polymerization initiator (A) contains a titanocene compound represented by chemical formula (1) given below, and the second photo-radical polymerization initiator (B) contains an amino acetophenone derivative represented by chemical formula (2) given below or an acylphosphine oxide derivative represented by chemical formula (3) or (4) given below:

11. A holographic recording medium, comprising a recording layer comprising:
   a three-dimensional cross-linked polymer matrix formed of a cured resin of 1,6-hexanediol diglycidyl ether with either an amine or an organic acid ride as a curing agent;
   a radical-polymerizable compound; and
   first and second photo-radical polymerization initiators (A) and (B) each exhibiting absorption to a wavelength of recording light, the first photo-radical polymerization initiator (A) having an absorption maximum at a wavelength longer than that of the recording light, and the second photo-radical polymerization initiator (B) having an absorption maximum at a wavelength shorter than that of the recording light.

12. The holographic recording medium according to claim 11, wherein the curing agent is an aliphatic primary amine.

13. The holographic recording medium according to claim 11, further comprising a curing catalyst for the epoxy compound.

14. The holographic recording medium according to claim 11, wherein a total mixing ratio of the first and second photo-radical polymerization initiators (A) and (B) is 0.1 to 20% by weight based on the entire recording layer.

15. The holographic recording medium according to claim 11, wherein the radical-polymerizable compound is contained in the three-dimensional cross-linked polymer matrix in a ratio of 1 to 50% by weight.

16. The holographic recording medium according to claim 11, wherein the recording layer is sandwiched between a pair of transparent substrates.

17. The holographic recording medium according to claim 16, wherein one of the transparent substrates is provided with a reflecting layer.

* * * * *